United States Patent
Iino et al.

(10) Patent No.: US 6,197,108 B1
(45) Date of Patent: Mar. 6, 2001

(54) SILICON SEED CRYSTAL, METHOD OF MANUFACTURING THE SAME, AND METHOD OF MANUFACTURING SILICON MONOCRYSTAL THROUGH USE OF THE SEED CRYSTAL

(75) Inventors: Eiichi Iino; Masanori Kimura, both of Annaka (JP)

(73) Assignee: Shin-Etsu Handotai, Co. Ltd., Gunma-Ken (JP)

( * ) Notice: Subject to any disclaimer, the term of this patent is extended or adjusted under 35 U.S.C. 154(b) by 0 days.

(21) Appl. No.: 09/211,679

(22) Filed: Dec. 14, 1998

Related U.S. Application Data

(62) Division of application No. 09/082,168, filed on May 20, 1998, now abandoned.

(30) Foreign Application Priority Data

| May 21, 1997 | (JP) | ..................................................... 9-147320 |
| Jan. 14, 1998 | (JP) | ..................................................... 10-17766 |

(51) Int. Cl.⁷ ................................................. C30B 15/20
(52) U.S. Cl. ............................ 117/13; 117/218; 117/900; 117/911
(58) Field of Search ............................. 117/13, 218, 900, 117/911

(56) References Cited

U.S. PATENT DOCUMENTS

| 2,543,071 | 2/1951 | Slawson . |
| 3,135,585 | 6/1964 | Dash . |
| 3,271,118 | 9/1966 | Bhola . |
| 3,515,576 | 6/1970 | Manasevit . |
| 4,010,064 | 3/1977 | Patrick et al. . |
| 4,040,895 | 8/1977 | Patrick et al. . |
| 4,973,518 | 11/1990 | Kida et al. . |
| 5,769,941 | 6/1998 | Chiou . |
| 5,833,750 | * 11/1998 | Mitzuishi et al. .................... 117/218 |
| 5,851,287 | * 12/1998 | Soeta ..................................... 117/208 |
| 5,885,344 | 3/1999 | Kim et al. . |
| 5,911,822 | * 6/1999 | Abe et al. .............................. 117/13 |

FOREIGN PATENT DOCUMENTS

| 62-288191 | 12/1987 | (EP) . |
| 4104988 | 4/1992 | (EP) . |
| 4139092 | 5/1992 | (EP) . |
| 5139880 | 6/1993 | (EP) . |
| 8319192 | 12/1996 | (EP) . |
| 0854211 | 7/1998 | (EP) . |
| 854211 | 7/1998 | (EP) . |
| 879903 | 11/1998 | (EP) . |
| 887443 | 12/1998 | (EP) . |
| 923408 | 4/1963 | (GB) . |
| 4104988 | 4/1992 | (JP) . |
| 4-139092 | 5/1992 | (JP) . |
| 5139880 | 6/1993 | (JP) . |
| 9235186 | 9/1997 | (JP) . |
| 9255485 | 9/1997 | (JP) . |

\* cited by examiner

*Primary Examiner*—Felisa Hiteshew
(74) *Attorney, Agent, or Firm*—Hogan & Hartson, LLP.

(57) ABSTRACT

In a method of manufacturing a silicon monocrystalline ingot using the Czochralski (CZ) method, there is used a seed crystal whose tip end has a sharp-pointed shape or a truncation thereof, and the maximum apex angle is not less than 3° but not greater than 28°. In this case, a monocrystal having an etched tip end portion or a monocrystalline ingot manufactured in accordance with the CZ method and having a tail portion is used as the seed crystal. Further, there may be used a silicon seed crystal having a tapered tip end portion of a conical or pyramidal shape, a straight body portion of a cylindrical columnar or rectangular columnar shape, and an intermediate portion located between the tip end portion and the straight body portion and having a truncated conical or pyramidal shape formed by a curved outer surface. A silicon monocrystalline ingot having a desired diameter is grown through use of such a seed crystal without performance of necking.

9 Claims, 6 Drawing Sheets

7

8

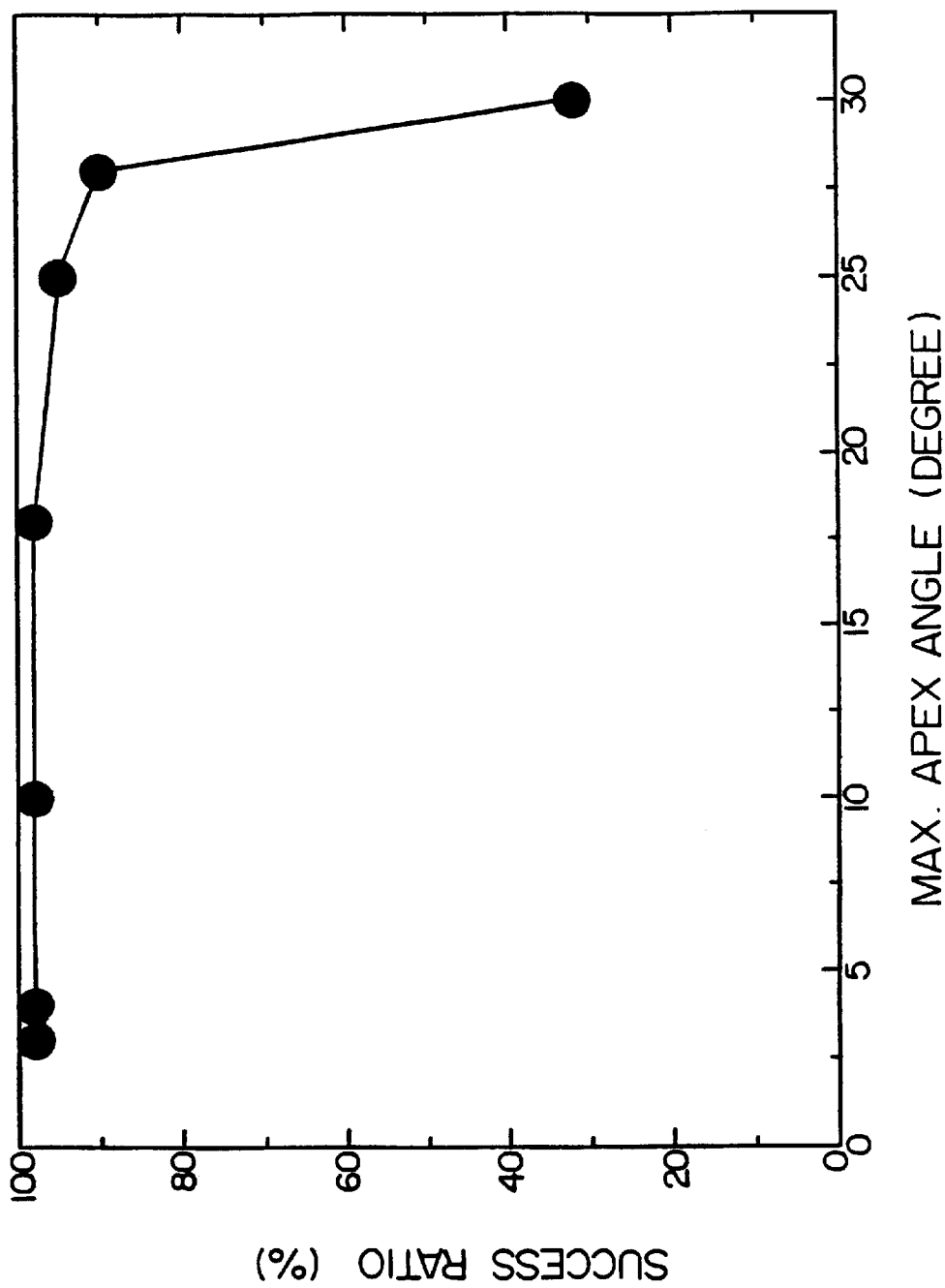

SILICON SEED CRYSTAL, METHOD OF MANUFACTURING THE SAME, AND METHOD OF MANUFACTURING SILICON MONOCRYSTAL THROUGH USE OF THE SEED CRYSTAL

This is a division of application Ser. No. 09/082,168 filed May 20, 1998 now abandoned, which application is hereby incorporated by reference in its entirety.

BACKGROUND OF THE INVENTION

1. Field of the Invention

The present invention relates to a method of manufacturing a silicon monocrystal in accordance with the Czochralski (CZ) method without performing a so-called necking operation. Further, the present invention relates to a seed crystal for use in the manufacturing method, as well as to a method of manufacturing such a seed crystal.

2. Description of the Related Art

In the manufacture of a silicon monocrystal using the Czochralski (CZ) method, monocrystalline silicon has conventionally been used as a seed crystal. A silicon monocrystalline ingot is grown by bringing the seed crystal into contact with the silicon melt and pulling the seed crystal slowly while it is rotated. At this time, operation for forming a neck portion (necking operation) is performed in order to eliminate dislocations generated in the seed crystal at a high density as a result of thermal shock arising when the seed crystal is brought into contact with the silicon melt. Subsequently, the diameter of the crystal is increased to a desired diameter, and the silicon monocrystalline ingot is then pulled. The necking operation has been well known as a "Dash Necking Method," and use of this method has been a common practice in the case where a silicon monocrystal ingot is pulled in accordance with the CZ method.

Specifically, as shown in FIGS. 4A and 4B, a conventional seed crystal is formed into a cylindrical shape having a diameter of about 8–20 mm or into a prismatic shape having sides of about 8–20 mm, and a cutaway portion is formed for attachment to a seed crystal holder. The tip or lower end of the seed crystal, which end first comes into contact with silicon melt, is formed to have a flat surface. In order to safely pull a heavy monocrystalline ingot while sustaining the weight of the ingot, the seed crystal must have a dimension in the above-described range.

However, since the seed crystal having the above-described shape and dimension has a large heat capacity at the tip end which comes into contact with silicon melt, a steep temperature gradient is generated instantaneously within the seed crystal when the seed crystal comes into contact with the melt, so that slip dislocation is generated at a high density. Therefore, the above-described necking operation is required for growing a monocrystal while eliminating the dislocation.

In the Dash Necking Method, after a seed crystal is brought into contact with silicon melt, the diameter of the crystal is reduced to about 3 mm before being increased, in order to form a neck portion to thereby eliminate dislocation induced from slip dislocation generated in the seed crystal and thereby to be grown a dislocation-free monocrystal.

However, in such a method, even when conditions for the necking operation are selected appropriately, the diameter of the crystal must be decreased to 5–6 mm or less in order to eliminate the dislocation. In such a case, the strength becomes insufficient to support a monocrystalline ingot whose weight has been increased with a recent increase in the diameter thereof, resulting in a high risk of fracture of the neck portion during the course of pulling of the monocrystalline ingot. This may result in serious accidents such as a drop of the monocrystalline ingot.

To solve the above-described problem, there has been developed a method of pulling a recent heavy large-diameter monocrystalline ingot through use of a crystal holding mechanism (see, e.g., Japanese Patent Publication (kokoku) No. 5-65477).

In this method, a growing monocrystalline ingot is held directly and mechanically, in consideration of the above-described knowledge that necking operation is indispensable for elimination of dislocation and that therefore the strength of the neck portion cannot be increased.

However, in such a method, a monocrystalline ingot—which is grown at a high temperature while being rotated—is directly held, an apparatus used for implementing the method becomes complicated and expensive and also raises a problem related to heat resistance. Further, in practice, it is extremely difficult to hold a growing crystal without generating vibration therein, so that the growing crystal may become a polycrystal. Moreover, since a complicated apparatus including mechanisms for rotation, sliding, and other motions must be disposed above a silicon melt of high temperature, there arises a problem that the crystal may be contaminated by heavy metal impurities.

In order to solve these problems, that applicant of the present invention has proposed various inventions such as those disclosed in Japanese Patent Application Laid-Open (kokai) No. 5-139880 and Japanese Patent Application No. 8-87187. According to these inventions, the tip end of a seed crystal is formed into a wedge shape or is formed to have a hollow portion in order to reduce, to the extent possible, slip dislocation which would otherwise be generated when the seed crystal comes into contact with silicon melt. These inventions enable elimination of dislocation, even when the neck portion is formed to have a relatively large diameter, thereby increasing the strength of the neck portion.

Although the methods according to the inventions can increase the strength of the neck portion to some degree through an increase in the diameter of the neck portion, the methods still require necking operation, resulting in formation of a neck portion having slip dislocation. Therefore, in some cases, the strength of the neck portion of a monocrystalline ingot manufactured in accordance with either of these methods becomes insufficient for pulling the ingot if the monocrystalline ingot has a weight of 150 Kg or more as a result of recent increases in the diameter and length thereof. Accordingly, the methods do not thoroughly solve the problems involved in the prior art methods.

In order to solve the above-described problems, the applicant of the present application has successfully developed a method of manufacturing a silicon monocrystal, which method can make a growing crystal monocrystalline without performance of a necking operation for forming a neck portion, which would cause a problem in terms of strength, thereby enabling a heavy silicon monocrystal having a large diameter and length to be pulled quite simply while eliminating the necessity of using a complicated apparatus such as a crystal holding mechanism. The applicant of the present application has also developed a seed crystal used in the method (Japanese Patent Application No. 9-17687).

In this method, the tip end of a crystal used as a seed crystal, which end comes into contact with silicon melt, has a sharp-pointed shape or a truncation thereof. After the tip end of the seed crystal is gently brought into contact with the silicon melt, the seed crystal is lowered at a low speed in order to melt the tip end portion of the seed crystal until the thickness of the tip portion increases to a desired value. Subsequently, the seed crystal is pulled slowly in order to grow a silicon monocrystalline ingot having a desired diameter without a necking operation being performed.

This method can thoroughly solve the problems involved in formation of a neck portion because the method does not includes necking. Therefore, the above-described method is considerably excellent. However, a subsequent running test revealed that, depending on the shape of a seed crystal and the method of manufacturing the same, dislocation is likely to be generated in the seed crystal when the tip end of the seed crystal comes into contact with silicon melt and melts, and that generation of such dislocation makes subsequent growth of the monocrystal difficult, resulting in a decreased success ratio in obtaining a dislocation-free monocrystal.

Further, in this method, if dislocation is once generated in the seed crystal, the pulling operation cannot be performed again unless the seed crystal is replaced with a new one. Therefore, increasing the success ratio is especially important.

Further, even when no dislocation is generated when the tip end of the seed crystal comes into contact with silicon melt, generation of slip dislocation sometimes occurs when the thickness becomes equal to or greater than a certain value (about 5 mm in diameter) during the operation of melting the tapered portion of the tip end of the seed crystal to obtain a desired thickness. Therefore, in some cases, the ratio of success in making crystals dislocation free (hereinafter referred to as the "dislocation-elimination success ratio") is not high, and a sufficient degree of reproducibility cannot be obtained.

SUMMARY OF THE INVENTION

The present invention has been conceived in view of the foregoing drawbacks in the prior art. An object of the present invention is to provide an improved method of manufacturing a silicon monocrystal in accordance with the Czochralski (CZ) method without performing a so-called necking operation, which method can increase the ratio of success in making grown crystals monocrystalline.

Anther object of the present invention is to provide a silicon seed crystal used in the method.

Still anther object of the present invention is to provide a method of manufacturing such a silicon seed crystal used in the method of manufacturing a silicon monocrytsal.

To achieve the objects, the present invention provides a silicon seed crystal used for manufacture of a silicon monocrystalline ingot according to the CZ method, wherein the tip end of the seed crystal to be brought into contact with silicon melt has a sharp-pointed shape or a truncation thereof; and the maximum apex angle of the tip end is not greater than 28°.

Since the tip end of the seed crystal has a sharp-pointed shape or a truncation thereof, and the maximum apex angle of the tip end is not greater than 28°, a contact area through which the tip end of the seed crystal is first brought into contact with the silicon melt is sufficiently small, and the heat capacity of the tip end portion is sufficiently low. Thus, there if prevented generation of thermal shock or a steep temperature gradient within the seed crystal when the seed crystal is brought into contact with the silicon melt, so that generation of slip dislocation is prevented.

When the seed crystal is lowered at a low speed such that the tip end portion of the seed crystal is melted until the size of the tip portion increases to a desired value, the contact area between the immersed portion of the seed crystal and the melt gradually increases. Therefore, the seed crystal can be melted to a desired thickness without formation of a steep temperature gradient within the seed crystal, so that no slip dislocation is generated within the seed crystal during the above-described melting operation.

Accordingly, the seed crystal can be reliably brought into contact with silicon melt and melted without generation of slip dislocation, thus enabling successive growth of a monocrystalline ingot without necking.

Preferably, the maximum apex angle of the seed crystal of the present invention is set to be not less than 3° but not greater than 28°.

When the maximum apex angle of the seed crystal is set to be not less than 3°, there can be obtained a sufficient effect of preventing generation of a slip dislocation. In consideration of this fact, as well as reduction in melting time, easiness of manufacture of the seed crystal, and the strength of the tip end of the seed crystal, the above-described angular range is preferably set for the maximum apex angle of the seed crystal.

Preferably, at least the tip end of the silicon seed crystal to be brought into contact with silicon melt is etched.

When the tip end of the silicon seed crystal to be brought into contact with silicon melt is etched, there can be removed mechanical damage that has been introduced to the surface of the seed crystal during mechanical machining of the seed crystal. Therefore, even when the tip end of the seed crystal is brought into contact with silicon melt and melted therein, there is not generated slip dislocation, which would otherwise be generated due to the mechanical damage. Thus, the seed crystal can more reliably be brought into contact with silicon melt and melted therein without generation of dislocation.

In this case, at least the tip end of the seed crystal is preferably removed through etching in an amount of 300 microns or more.

When at least the tip end of the seed crystal is removed through etching in an amount of 300 microns or more, a damaged surface portion can be reliably removed, so that generation of slip dislocation stemming from such a damaged surface portion can be prevented.

The silicon seed crystal according to the present invention may be a silicon seed crystal that is manufactured in accordance with the CZ method and has a tail portion serving as the sharp-pointed tip end.

When there is used a seed crystal manufactured in accordance with the CZ method and having a tail portion serving as the sharp-pointed tip end, mechanical machining or the like is not required. Further, since there exists no damaged surface portion stemming from mechanical machining or the like, the above-described etching becomes unnecessary.

The present invention also provide a silicon seed crystal used for manufacture of a silicon monocrystalline ingot according to the CZ method, wherein the silicon seed crystal has a tapered tip end portion of a conical or pyramidal shape, a straight body portion of a cylindrical columnar or rectangular columnar shape, and an intermediate portion located between the tip end portion and the straight body portion and having a truncated conical or pyramidal shape formed by a curved outer surface.

The structure in which the intermediate portion having a truncated conical or pyramidal shape formed by a curved outer surface is formed between the tip end portion and the straight body portion greatly reduces generation of slip dislocation and increases the dislocation-elimination success ratio. When the sharp-pointed tip end of a silicon seed crystal is melted in silicon melt, thermal stress is generated but remains relatively low until the thickness of the melted tip end reaches about 5 mm, and therefore slip dislocation is hardly generated. However, when the thickness of the melted tip end exceeds about 5 mm, the thermal stress increases gradually with the thickness. Accordingly, if the diameter of the melted tip end is increased at the same rate as that used when the diameter is small, the thermal stress—which is already relatively high—becomes higher abruptly, therefore increasing the possibility that mitigation of the thermal stress becomes insufficient, resulting in generation of slip dislocation. In view of the foregoing, in the portion where the diameter becomes greater than a critical diameter above which slip dislocation occurs easily, the seed crystal is designed to have a truncated conical or pyramidal shape formed by a curved outer surface in which the ridge lines connecting the tapered tip end portion and the straight body portion are smooth curves, thereby decreasing the rate of diameter increase. Therefore, it becomes possible to mitigate the thermal stress and melt the tip end up to a point where the tip end has a desired large diameter without generation of slip dislocation. Thus, the dislocation-elimination success ratio is increased, and a heavy monocrystalline ingot having a large diameter can be grown.

The present invention also provides a method of manufacturing a silicon seed crystal used for manufacture of a silicon monocrystalline ingot according to the CZ method, wherein the tip end of the seed crystal to be brought into contact with silicon melt has a sharp-pointed shape or a truncation thereof, the method comprising the steps of:

mechanically machining into a desired shape a silicon monocrystalline ingot serving as a material of the seed crystal; and etching at least the tip end to be brought into contact with silicon melt.

Since a seed crystal is manufactured in a manner such that a silicon monocrystalline ingot is mechanically machined into a desired shape and then etched, the seed crystal can be reliably machined such that it has a desired tip end shape and has no mechanical damage on the surface.

The present invention also provides a method of manufacturing a silicon seed crystal used for manufacture of a silicon monocrystalline ingot according to the CZ method, wherein the tip end of the seed crystal to be brought into contact with silicon melt has a sharp-pointed shape or a truncation thereof, the method comprising the steps of:

selecting a silicon monocrystalline ingot manufactured in accordance with the CZ method and having a tail portion; and using the tail portion as the sharp-pointed portion of the seed crystal.

When a silicon monocrystalline ingot manufactured in accordance with the CZ method and having a tail potion is selected, and the tail portion is used as the sharp-pointed portion of the seed crystal, mechanical machining or the like is not required for forming the tip end. Therefore, manufacture of the seed crystal can be simplified. Further, material can be saved. Moreover, the manufactured seed crystal does not have any mechanical damage at its surface.

The present invention further provides a method of manufacturing a silicon monocrystal ingot in accordance with the CZ method in which a seed crystal is brought into contact with silicon melt and is then pulled slowly, while being rotated, in order to grow the silicon monocrystalline ingot, characterized in that the method comprising the steps of:

using a seed crystal according to the present invention or a seed crystal manufactured according to the method of the present invention;

gently brining the tip end of the seed crystal into contact with silicon melt and lowering the seed crystal at a low speed in order to melt the tip end of the seed crystal until the thickness of the tip end reaches a desired level; and slowly pulling the seed crystal to grow a silicon monocrystalline ingot having a desired diameter without performing necking.

As described above, since the seed crystal and the method of manufacturing the seed crystal according to the present invention reliably prevent generation of slip dislocation which would otherwise be generated when the seed crystal comes into contact with silicon melt or melts therein, the dislocation-elimination success ratio can be increased if a silicon monocrystalline ingot is grown through use of the seed crystal without necking being performed.

The present invention further provides a method of manufacturing a silicon monocrystal ingot in accordance with the CZ method in which a silicon seed crystal having a sharp-pointed end is brought into contact with silicon melt, is melted therein, and is then pulled in order to grow the silicon monocrystalline ingot without performance of necking, characterized in that when the tip end of the silicon seed crystal is melted into the silicon melt, the melting speed after the position where the thickness reaches a critical thickness above which slip dislocation easily occurs is made lower than the melting speed before that position.

As described above, in the method of manufacturing a silicon monocrystalline ingot according to the present invention, the melting speed after the position where the thickness reaches a critical thickness above which slip dislocation easily occurs is made lower than the melting speed before that position when the tip end of the silicon seed crystal is melted into the silicon melt. Therefore, at positions where the thickness of the tip end is greater than the critical thickness, the thermal stress per unit time is greatly mitigated, so that the position above which slip dislocation easily occurs is shifted to a thicker side. This allows the monocrystalline ingot pulling operation to be started in a dislocation-free manner from a thicker-side position with respect to the conventional position. Therefore, the method can increase the dislocation-elimination success ratio, and can sufficiently cope with an increase in the diameter and weight of monocrystalline ingots.

Alternatively, when the tip end of the silicon seed crystal is melted into the silicon melt, the speed of melting is changed in two stages such that the speed of melting in the second stage becomes lower than that in the first stage.

In this case, there is mitigated the thermal stress per unit time at positions where the thickness of the tip end becomes larger after the speed of melting has been changed, so that the position above which slip dislocation occurs easily is shifted to the thicker side. Therefore, if the monocrystal is pulled slowly from the shifted position, it becomes possible to increase dislocation-elimination success ratio, and to sufficiently cope with an increase in the diameter and weight of monocrystalline ingots.

The present invention further provides a method of manufacturing a silicon monocrystal ingot in accordance with the CZ method in which a silicon seed crystal having a sharp-pointed end is brought into contact with silicon melt, is melted therein, and is then pulled in order to grow the silicon monocrystalline ingot without necking operation, characterized by use of a silicon seed crystal having a tapered tip end portion of a conical or pyramidal shape, a straight body portion of a cylindrical columnar or rectangular columnar shape, and an intermediate portion located between the tip end portion and the straight body portion and having a truncated conical or pyramidal shape formed by a curved outer surface.

In the case where the speed of melting the tip end of a seed crystal is constant, the area of the melting interface increases in proportion to lapse of time at the conical or pyramid-shaped tapered portion having straight ridge lines. However, in the regions corresponding to the truncated conical or pyramidal shape formed by a curved outer surface, the rate of increase in the distance between the ridge lines decreases considerably up to the cylindrical or rectangular columnar body portion compared to that at the tip end taper portion, and the thermal stress generated at positions on the thicker side of the position where the shape of the ridges changes is mitigated greatly. Therefore, the position above which slip dislocation occurs easily is shifted to the thicker side. This allows the monocrystalline ingot pulling operation to be started in a dislocation-free manner from the shifted position, so that dislocation-elimination success ratio increases, and an increase in the diameter and weight of monocrystalline ingots can be coped with sufficiently.

The present invention further provides a method of manufacturing a silicon monocrystal ingot in accordance with the CZ method, characterized in that there is used a silicon seed crystal having a tapered tip end portion of a conical or pyramid shape, a straight body portion of a cylindrical columnar or rectangular columnar shape, and an intermediate portion located between the tip end portion and the straight body portion and having a truncated cone or pyramid shape formed by a curved outer surface, and that when the tip end of the silicon seed crystal is melted into the silicon melt, the melting speed after the position where the thickness reaches a critical thickness above which slip dislocation easily occurs is made lower than the melting speed before that position.

In this case, especially when the position above which slip dislocation easily occurs is made to coincide with the position from which the truncated conical or pyramidal shape starts, thermal stress generated per unit time can be mitigated greatly by the synergistic effect of the reduction in the diameter increase rate and the reduction of melting speed, so that the position above which slip dislocation is easily generated can be shifted to the thicker side. This allows the monocrystalline ingot pulling operation to be started in a dislocation free manner from the shifted position, so that the dislocation-elimination success ratio increases, and an increase in the diameter and weight of monocrystalline ingots can be coped with sufficiently.

The present invention further provides a method of manufacturing a silicon monocrystal ingot in accordance with the CZ method, characterized in that there is used a silicon seed crystal having a tapered tip end portion of a conical or pyramid shape, a straight body portion of a cylindrical columnar or rectangular columnar shape, and an intermediate portion located between the tip end portion and the straight body portion and having a truncated cone or pyramid shape formed by a curved outer surface, and that when the tip end of the silicon seed crystal is melted into the silicon melt, the speed of melting is changed in two stages such that the speed of melting in the second stage is made lower than that in the first stage.

In this case, especially when the position where the melting speed is changed is made to coincide with the position from which the truncated conical or pyramidal shape starts, thermal stress can be mitigated greatly by the synergistic effect of the reduction in the diameter increase rate and the reduction of melting speed, so that the position above which strip dislocation is easily generated can be shifted to the thicker side. This allows the monocrystalline ingot pulling operation to be started in a dislocation free manner from the shifted position, so that the dislocation-elimination success ratio increases, and an increase in the diameter and weight of monocrystalline ingots can be coped with sufficiently.

As described above, according to the present invention, the dislocation-elimination success ratio can be improved substantially in the dislocation-free silicon monocrystal growth method in which necking is not performed. Further, since reproducibility is high, a high dislocation-elimination success ration can be maintained for a long period of time. Accordingly, the productivity and yield of large-diameter silicon monocrystalline ingots can be improved remarkably while production costs are reduced.

BRIEF DESCRIPTION OF THE DRAWINGS

FIGS. 1A–1D are perspective views of seed crystals according to the present invention, wherein FIG. 1A shows a cylindrical-columnar seed crystal having a conical tip end, FIG. 1B shows a rectangular-columnar seed crystal having a pyramidal tip end, FIG. 1C shows a cylindrical-columnar seed crystal having a horizontally truncated tip end, and FIG. 1D shows a cylindrical-columnar seed crystal having an obliquely truncated tip end;

FIGS. 2A and 2B are explanatory views showing the case where a seed crystal is manufactured through utilization of a tail portion of a monocrystalline ingot, wherein FIG. 2A shows the case where an ingot having a tail portion is manufactured in accordance with an ordinary CZ method, and FIG. 2B shows the case where a tail portion of a monocrystalline ingot for semiconductor wafers is utilized;

FIGS. 3A–3D are perspective views of previously proposed seed crystals according to the present invention, wherein FIG. 3A shows a cylindrical-columnar seed crystal having a conical tip end, FIG. 3B shows a rectangular-columnar seed crystal having a pyramidal tip end, FIG. 3C shows a cylindrical-columnar seed crystal having a horizontally truncated tip end, and FIG. 3D shows a cylindrical-columnar seed crystal having an obliquely truncated tip end;

FIGS. 4A and 4B are perspective views of conventional seed crystals, wherein FIG. 4A shows a cylindrical-columnar seed crystal, and FIG. 4B shows a rectangular-columnar seed crystal;

FIG. 5 is a graph showing the results of Examples and Comparative Examples;

DETAILED DESCRIPTION OF THE PREFERRED EMBODIMENTS

Figure 1A:
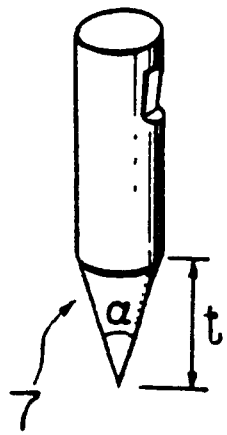

Embodiments of the present invention will now be described. However, the present invention is not limited to the embodiments.

When a monocrystal is grown according to the CZ method without necking, it is essential to prevent generation of slip dislocation within a seed crystal when a seed crystal is brought into contact with silicon melt and is gradually melted until the melted tip end has a desired diameter. Therefore, the success ratio in growing a monocrystal without performing necking greatly depends on the degree of elimination of slip dislocation which is generated when the seed crystal is brought into contact with silicon melt and melted thereby.

The inventors of the present invention conducted various experimental studies in relation to the shape of a seed crystal that reliably prevents generation of slip dislocation which would otherwise be generated when the seed crystal is brought into contact with silicon melt and melted thereby, as well as a manufacturing method for such a seed crystal. Based on the results of the experimental studies, the inventors conceived the present invention.

A seed crystal used in a method of growing a monocrystalline ingot without necking must have a sharp-pointed tip end that may or may not be truncated.

In the case where the seed crystal has such a shape, when the tip end of the seed crystal is first brought into contact with silicon melt, the area of contact with the silicon melt is small, and the heat capacity of the tip end portion is small. Therefore, within the seed crystal there is not generated a thermal shock or steep temperature gradient, so that no slip location is generated.

When the seed crystal is subsequently gradually lowered and the tip end portion of the seed crystal is melted until the thickness becomes a predetermined level, the area of contact between the seed crystal and the silicon melt increases gradually. Therefore, the seed crystal can be melted without formation of a steep temperature gradient within the seed crystal, and when the seed crystal is melted no slip dislocation is generated therein.

As is described in Japanese Patent Application No. 9-17687, so far the following principles in relation to the shape of seed crystals have been discovered.

(1) A sharp-pointed shape or a truncation thereof employed for the tip end of a seed crystal is preferably in the form of a conical or pyramidal shape.

(2) In this case, as shown in FIGS. 3A–3D, the length t of the conical portion 7 or pyramidal portion 8 of a seed crystal is arbitrary. However, the length t may be set to be one to ten times, preferably two to eight times, the thickness or diameter of the seed crystal.

(3) When the tip end has a pyramidal shape, the tip end may have a triangular pyramidal shape, a rectangular pyramidal shape, or other polygonal pyramidal shape. Further, the cross-sectional shape of the straight body portion of the seed crystal is not required to correspond to the cross-sectional shape of the tip end portion, and the tip end portion of a rectangular-columnar seed crystal may be machined into a conical shape. The above-described shapes may be combined arbitrarily.

Figure 3A:
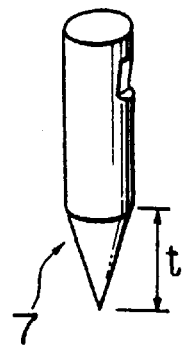
Figure 3B:
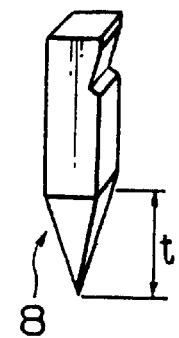
Figure 3C:
Figure 3D:
Figure 4A:
Figure 4B:

(4) The tip end of a seed crystal may be formed into a truncated sharp-pointed shape as shown in FIG. 3C, or into the untruncated sharp-pointed shape as shown in FIGS. 3A and 3B. The manner of truncating the tip end is not limited to horizontal truncation; as shown in FIG. 3D the tip end may be truncated obliquely. In this case, the area of a tip end surface of a seed crystal to be first brought into contact with silicon melt may be set to not greater than $9\pi$ (mm$^2$), preferably not greater than $2.25\pi$ (mm$^2$).

Seed crystals having the above-described specific shape enable manufacture of monocrystalline ingots without necking. Therefore, the above-described requirements apply to the present invention as they are. However, the above-described requirements are not sufficient for reliable achievement of a high success ratio, and the shape of seed crystals must be improved and specified more definitely in order to allow a seed crystal to come into contact with silicon melt to be melted thereby without generation of dislocation.

In view of the foregoing, the present inventors investigated in detail the relationship between the degree of sharpness of a seed crystal and the success ratio in growing a monocrystalline ingot without performing necking. More specifically, the inventors investigated the relationship between the maximum apex angle of a seed crystal and the dislocation elimination ratio of grown monocrystalline ingots.

The results of investigation show that the success ratio sharply decreases when the maximum apex angle of the seed crystal exceeds 28°. Although the specific cause of the phenomenon has not been found, the phenomenon conceivably occurs according to the following mechanism. That is, when the maximum apex angle exceeds 28°, the heat capacity of the tip end portion becomes excessive, so that slip dislocation is generated due to thermal shock when the seed crystal comes into contact with silicon melt; or during a subsequent melting operation, a steep temperature gradient is formed due to an excessively high rate of increase in the contact area, so that slip dislocation is generated even when the melting speed is decreased.

Accordingly, in order to increase the success ratio, the seed crystal of the present invention preferably has a maximum apex angle not greater than 28° at its tip end.

The term "maximum apex angle" used herein means the apex angle of the tip end portion to be brought into contact with silicon melt, as shown in FIGS. 1A–1D, and more specifically a maximum apex angle $\alpha$ that is the largest apex angle among those of all possible cross sections. Therefore, in the case of a seed crystal having a conical tip end shown in FIG. 1A, the maximum apex angle is equal to the apex angle of the cone (constant). However, in the case of a seed crystal having a pyramidal tip end shown in FIG. 1B, the maximum apex angle is the apex angle of a diagonal cross section.

Figure 1B:
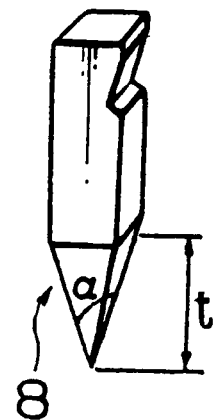
Figure 1C:
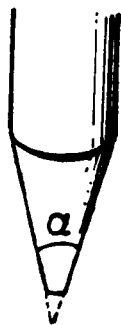
Figure 1D:
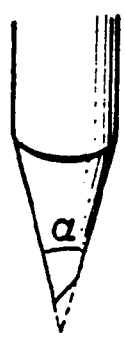

In the present invention as well, the shape of the tip end of a seed crystal is not limited to a sharp-pointed shape as shown in FIGS. 1A and 1B, and may be a truncated sharp-pointed shape, as shown in FIG. 1C. The manner of truncating the tip end is not limited to horizontal truncation; as shown in FIG. 1D the tip end may be truncated obliquely. In this case, the term "maximum apex angle" used in the present invention means a maximum apex angel $\alpha$ of the sharp-pointed tip end before the tip end is truncated.

Although from the viewpoint of prevention of generation of slip dislocation within a seed crystal the maximum apex angle $\alpha$ is desirably as small as possible, from the practical viewpoint the maximum apex angle $\alpha$ is preferably set equal to or greater than 3°.

When the tip end of a seed crystal is sharpened to have a maximum apex angle of 3°, there is obtained a sufficient effect of preventing generation of slip dislocation. Making the tip end of a seed crystal sharper to have a maximum apex angle of less than 3° is not preferable, because such machining is difficult due to brittleness and hardness of the seed crystal (silicon monocrystal), and there would arise problems relating to handling, such as the occurrence of breakage. Moreover, as the degree of sharpness of the tip end increases, the time required to melt the tip end length t increases, so that manufacture of a monocrystalline ingot includes wasted time.

Next will be described a method of manufacturing a seed crystal according to the present invention having the above-described shape. A silicon monocrystalline ingot is mechanically machined into a desired shape, i.e., such that the tip end to be brought into contact with silicon melt has a sharp-pointed shape or a truncation thereof, and such that the maximum apex angle of the tip end becomes not greater than 28°.

However, when a silicon monocrystalline ingot is mechanically machined into a desired shape in order to obtain a seed crystal, mechanical damage is generated at the surface of the seed crystal. Unless such mechanical damage is completely removed, slip dislocation is generated from the mechanical damage when the seed crystal is brought into contact with the silicon melt and melted thereby, even if the tip end of the seed crystal has the above-described desired shape. Thus, the dislocation elimination ratio decreases.

In the conventional CZ method in which necking is performed, slip dislocation is naturally generated in a neck portion, and slip dislocation stemming from mechanical damage is not a serious problem. However, in the present invention, since generation of slip dislocation within a seed crystal must be prevented thoroughly, the removal of mechanical damage is important.

In order to remove the mechanical damage at the surface, after the seed crystal is machined into a desired shape, at least the tip end thereof to be brought into contact with silicon melt is etched. By means of etching, the mechanical damage at the surface can be removed easily and reliably.

In addition to the mechanical damage at the surface due to mechanical machining, there may be generated surface distortion or damage due to other causes. In such a case, the surface distortion or damage due to other causes can be removed together with the mechanical damage due to mechanical machining, because the etching operation removes silicon throughout the entire surface of the seed crystal.

The etching operation is performed through immersion of the entire seed crystal into an etching solution. In this case, at least the tip end to be brought into contact with silicon melt and be melted thereby must be etched. No limitation is imposed on the etching solution insofar as the etching solution can etch silicon. For example, a mixed acid of hydrofluoric acid and nitric acid may be used.

An amount of stock removal by means of etching is preferably equal to or greater than 300 microns. This is because when the degree of mechanical damage stemming from mechanical machining is large, it generally reaches to a depth of 200 to 300 microns from the surface. Accordingly, if the etching is performed to remove silicon to a depth of 300 microns or more, the surface distortion or damage can be removed reliably. Thus, generation of slip dislocation stemming from the surface distortion or damage can be prevented.

The seed crystal manufactured in the above-described manner has a sharp-pointed shape having a desired degree of sharpness, and no distortion or damage at the surface. Use of such a seed crystal further decreases the possibility that slip dislocation is generated when the tip end of the seed crystal is brought into contact with silicon melt or melted thereby.

In another method of manufacturing a seed crystal, a monocrystalline ingot having a tail portion grown in accordance with an ordinary CZ method is utilized, instead of the tip end portion being formed into a desired shape through mechanical machining.

That is, a monocrystalline ingot having a tail portion, which is grown in accordance with the ordinary CZ method, is selected as a seed crystal, and the tail portion is used as the sharp-tip end of the seed crystal.

Figure 2A:
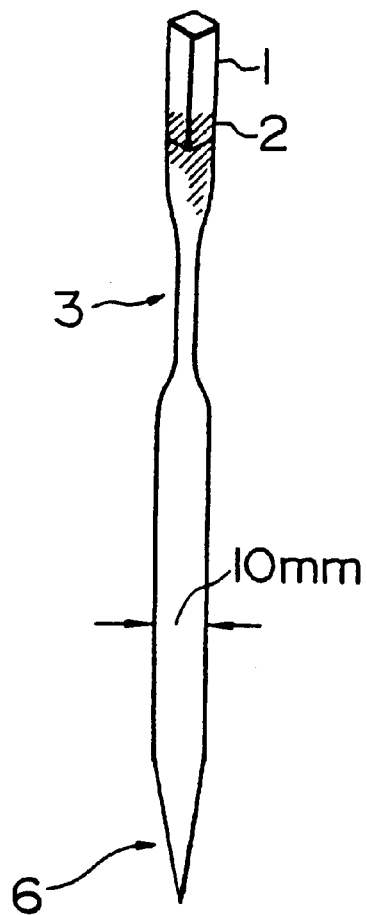

For example, as shown in FIG. 2A, after a seed crystal 1 is brought into contact with silicon melt, a necking operation is performed to form a neck portion 3 in order to eliminate dislocation. Subsequently, the diameter of the monocrystal is increased to a desired diameter (seed crystal diameter), and the monocrystal is grown while that diameter is maintained after which a tail portion 6 is formed to compete the growth of the monocrystal. The thus-formed tail portion of the manufactured small crystal is used as the tip end of the seed crystal. Further, a cutaway portion for setting the seed crystal to a seed crystal holder is formed at the end opposite the tail portion. In this manner, there can be manufactured a seed crystal having a desired tip end shape according to the present invention.

When the tail portion 6 manufactured in accordance with the CZ method is used as the sharp-pointed tip end of the seed crystal as described above, the tip end is not required to be formed into a desired shape by means of mechanical machining. Therefore, the method of manufacturing the seed crystal can be simplified and material can be saved. In addition, since the manufactured seed crystal does not have distortion or damage at its surface, the above-described etching operation is not required.

Figure 2B:
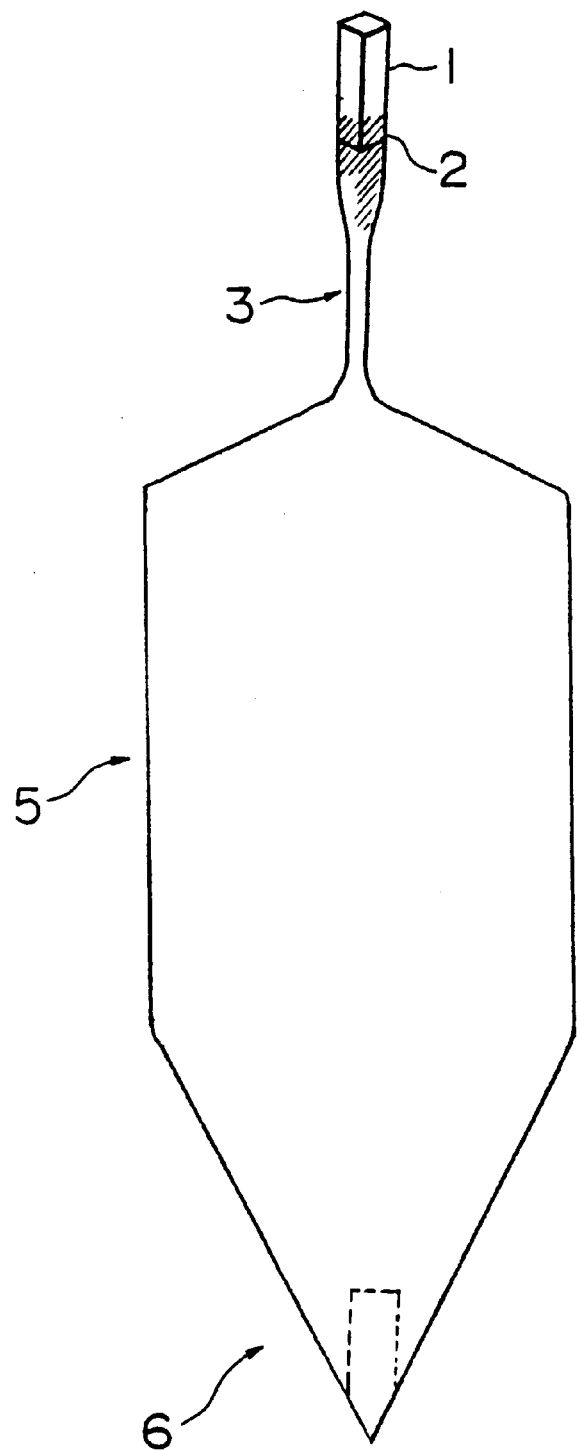

Also, the tail portion may be manufactured through a method other than the above-described method in which a crystal growing operation is performed for the sole purpose of manufacturing a seed crystal. That is, as indicated by the broken line in FIG. 2B, the seed crystal may be formed through utilization of the tail portion of a silicon monocrystalline ingot for semiconductors wafers that has been generally manufactured. The tail portion of such an ordinary silicon monocrystalline ingot is usually discarded because the diameter of the tail portion is smaller than the desired diameter. The use of the tail portion saves material and enables manufacture of a seed crystal at extremely low cost.

When a silicon monocrystalline ingot is grown through use of a seed crystal according to the present invention having the above-described characteristics or a seed crystal manufactured according to the method of the present invention, the success ratio in growing the silicon monocrystalline ingot without necking increases, because no slip dislocation is generated when the seed crystal is brought into contact with silicon melt or melted thereby.

EXAMPLES

Examples and Comparative Examples will now be described. However, the present invention is not limited thereto.

Examples and Comparative Examples

Seed crystals having different maximum apex angles at their tips were prepared, and each seed crystal was used to grow a monocrystalline ingot without necking. Then, the success rate in eliminating dislocation was investigated.

For each of the seed crystals, a 10 mm×10 mm rectangular columnar monocrystal of <100> orientation was used. The tip end of the monocrystal was mechanically machined into a conical shape having one of a variety of apex angles, and the entire monocrystal was immersed into an etching solution composed of hydrofluoric acid and nitric acid for etching.

The seed crystal was held just above silicon melt for 20 minutes in order to preheat the seed crystal sufficiently. Subsequently, the seed crystal was lowered at a speed of 2 mm/min. in order to gently bring the tip end of the seed crystal into contact with the silicon melt, and was further lowered at the same speed in order to melt the tip end of the seed crystal up to a point where the diameter of the tip end increased to about 6 mm. Subsequently, the seed crystal was pulled upward slowly without necking such that the diameter of the crystal increased to about 100 mm, and a straight body portion was grown to a length of 10 cm. Finally, a tail portion was formed to complete the growth of the silicon monocrystalline ingot.

The ratio of the number of grown monocrystalline ingots having no dislocation to the total number of grown monocrystalline ingots was calculated as a success ratio. The results of such calculation are shown in FIG. 5.

As is apparent from the results, the success ratio is high when the maximum apex angle of the seed crystal is not greater than 28° but sharply decreases when the maximum apex angle exceeds 28°.

Meanwhile, the present inventors found that in some cases the success ratio (dislocation elimination success ratio) did not reach a satisfactory level. The present inventors investigated the causes and found that generation of slip dislocation depends greatly on the melting speed at which the tapered tip end of a seed crystal is melted, as well as on the shape of the tapered tip end of the seed crystal.

First, the present inventors extracted the factors that enable dislocation-free growth of a monocrystalline ingot without necking and repeatedly performed investigations and experiments. As a result, the following conditions for eliminating dislocation were established.

The factor that was first investigated was the maximum diameter of the tip end of a seed crystal at which slip dislocation was generated during melting operation.

Figure 9:
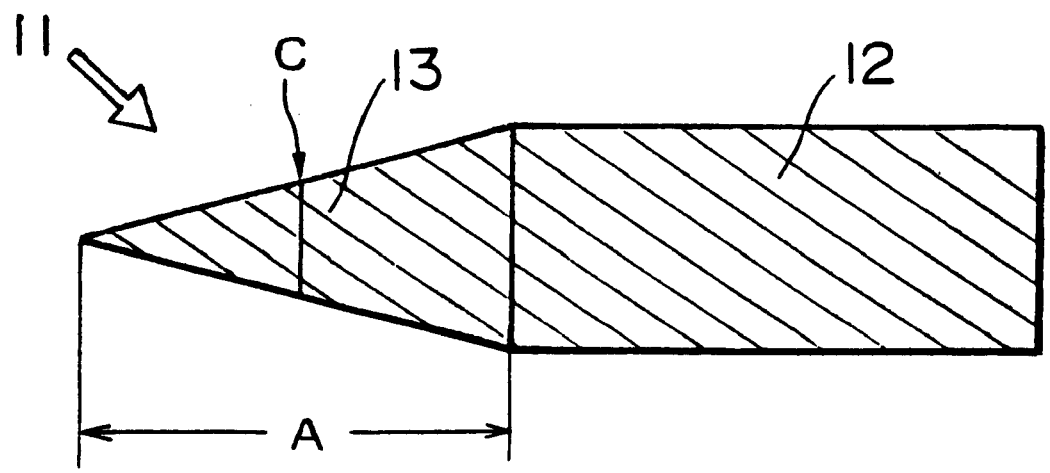
FIG. 9 is a vertical cross-sectional view showing the shape of a seed crystal used in a conventional dislocation-free crystal growing method.

A silicon monocrystalline ingot was machined to have a vertical cross section as shown in FIG. 9, and the thus-machined monocrystalline ingot was used as a seed crystal. That is, the tip end of a silicon monocrystalline ingot having a diameter of 15 mm (at the body portion 2) was machined into a conical shape such that the length of the tapered tip end portion 3 (straight taper portion A) became 70 mm. Subsequently, the surface of the silicon monocrystalline ingot was etched to a depth of about 400 $\mu$m through use of a mixed acid.

The slop of the outer surface (taper surface) is expressed as follows:

$$dr/dx = \text{constant} \ (d^2r/dx^2 = 0)$$

where r is the radius of a transversal cross section (circle) of the cone, and X is the axial position of the transversal cross section. The silicon monocrystalline ingot was machined along the outer surface into a conical shape such that the apex angle of the cone became 24°.

A monocrystalline ingot having a diameter of 150 mm was grown through use of the seed crystal 1 that had been machined in the above-described manner, and the dislocation-elimination success ratio was investigated (Test Nos. 1–4).

The dislocation-elimination success ratio (sometimes referred to as the "DF ratio") is a percentage of the total number of the grown monocrystalline ingots having no dislocation.

The above-described seed crystal was held just above silicon melt for 20 minutes in order to preheat the seed crystal sufficiently. Subsequently, the seed crystal was lowered to be dipped into silicon melt at a constant speed of 3 mm/min. in order to melt the tip end of the seed crystal, until the diameter of the tip end became a predetermined diameter, immediately after which the seed crystal was pulled upward from silicon melt, cooled, and taken out of the furnace. The seed crystal was then subjected to Secco etching in order to check generation of slip dislocation. The results are shown in Table 1.

Secco etching is an etching method in which, after oxide film at the surface of a crystal is removed through use of hydrofluoric acid, the surface is etched through use of a mixture of $K_2Cr_2O_7$, hydrofluoric acid, and water. Secco etching is used for checking the presence/absence of slip dislocation at the surface of a crystal.

TABLE 1

| | Item | | | |
|---|---|---|---|---|
| Test No. | Number of experiments | Max. dia. during melting (mm) | Number of ingots having slip dislocation | Dislocation-Elimination ratio [DF ratio] (%) |
| 1 | 10 | 3 | 0 | 100 |
| 2 | 10 | 4 | 0 | 100 |
| 3 | 10 | 5 | 1 | 90 |
| 4 | 10 | 6 | 4 | 60 |

From Table 1, it is understood that generation of slip dislocation starts when the maximum diameter during the operation of melting the tapered tip end of a seed crystal exceeds about 5 mm.

The above-described phenomenon is considered to occur due to the following reason. When the diameter of the melted portion of the seed crystal is small, thermal stress is small. However, the thermal stress gradually increases as the diameter increases. Accordingly, if the diameter of the melted portion is increased at the same rate as that used when the diameter was small, the thermal stress—which has already become relatively high—becomes higher abruptly, therefore there increases the possibility that mitigation of the thermal stress becomes insufficient, resulting in generation of slip dislocation.

In view of the foregoing, the influence of the melting speed during the melting operation was investigated (Test Nos. 5–8).

During the melting operation, each seed crystal was lowered at a constant speed of 3 mm/min. until the diameter of the tip end at the surface of the silicon melt became 4 mm, and thereafter the speed was decreased to 1.5 mm/min. and the melting operation was continued until the diameter of the tip end became a predetermined diameter. Subsequently, the seed crystal was immediately pulled upward from silicon melt, cooled, and taken out of the furnace. The seed crystal was then subjected to Secco etching in order to check generation of slip dislocation in the same manner as described above. The results are shown in Table 2.

TABLE 2

| Test No. | Number of experiments | Max. dia. during melting (mm) | Number of ingots having slip dislocation | Dislocation-Elimination ratio [DF ratio] (%) |
|---|---|---|---|---|
| 5 | 10 | 5 | 0 | 100 |
| 6 | 10 | 6 | 0 | 100 |
| 7 | 10 | 7 | 0 | 100 |
| 8 | 10 | 8 | 1 | 90 |

From Table 2, it is understood that if the melting speed is changed from the initial value of 3 mm/min. to 1.5 mm/min. (half the initial value) when the diameter exceeds about 5 mm—above which slip dislocation is easily generated—slip dislocation is not generated even when the diameter reaches about 5 mm, and the diameter can be increased to 7 mm.

The reason of this is conceivably as follows. As described above, when the diameter of the tapered tip end portion of the seed crystal is small, thermal stress is small even if the tip end portion is melted into silicon melt at a relatively high speed. However, the thermal stress gradually increases as the diameter increases. Accordingly, if the diameter of the melted tip end surface is increased at the same rate as that used when the diameter was small, the thermal stress—which has already become relatively high—becomes higher abruptly, so that generation of slip dislocation starts. Therefore, if the melting speed is decreased when the diameter has reached a critical diameter above which slip dislocation easily occurs in order to prevent abrupt increase of the thermal stress, a monocrystalline ingot can be pulled without causing generation of slip dislocation.

Subsequently, the shape of seed crystals, especially, the shape of the tapered tip end portion, was studied (Test Nos. 9–12).

Figure 6:
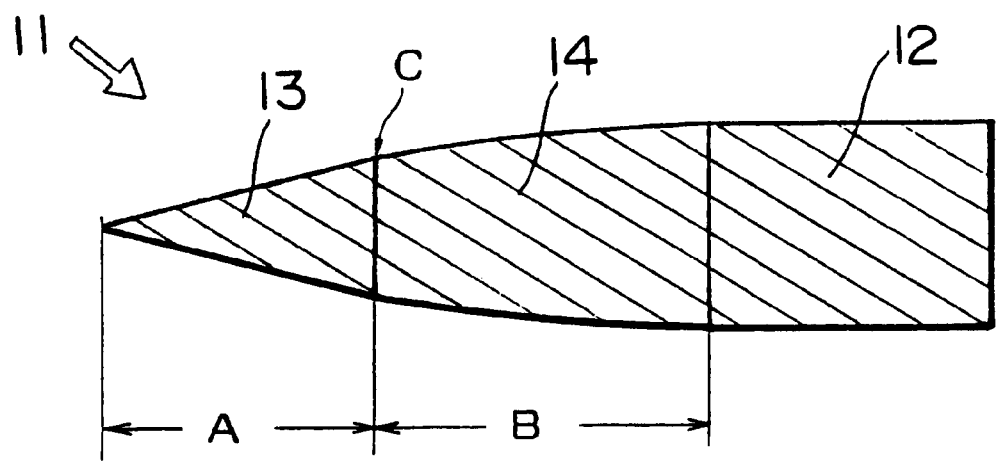
FIG. 6 is a vertical cross-sectional view showing the shape of a seed crystal used in a dislocation-free crystal growing method according to the present invention.
Figure 7:
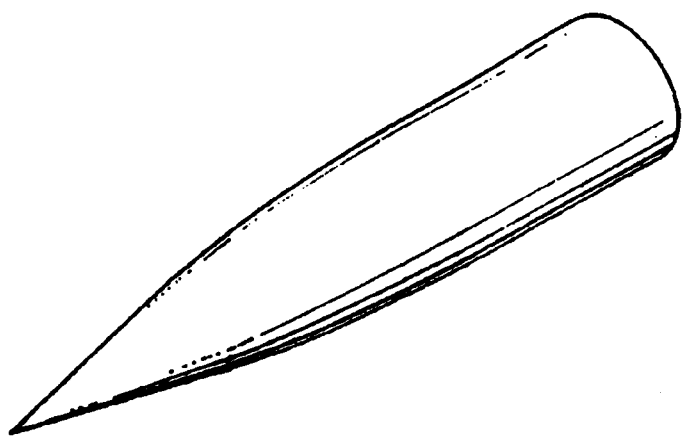
FIG. 7 is a perspective view showing the shape of a seed crystal having a conical tip end used in a dislocation-free crystal growing method according to the present invention.

FIG. 6 shows a vertical cross section of a seed crystal 11 according to the present invention, and FIG. 7 shows a perspective view showing the seed crystal 11 having a conical tip end. The seed crystal 11 has a tapered tip end portion 13, a truncated conical portion 14, and a straight body portion 12. The ridge line of the tapered tip end portion 13 (in straight taper portion A) is straight, and the ridge line of the truncated conical portion 14 (in curved taper portion B) is gently curved.

As in the above-described case, the straight body portion 12 of the seed crystal 11 had a diameter of 15 mm and the tapered tip end portion 13 was machined as follows.

The tip end portion was machined in the form of a straight taper from the tip end to a point where the diameter of the tip end portion was 4 mm (in straight taper portion A) such that the apex angle became 24°. From that point to the straight body portion (in curved taper portion B), the tip end portion was machined such that the diameter increase rate $d^2r/dx^2$ became −0.5.

Specifically, in FIG. 6, the length of the straight taper portion A was (4/15)×70 mm=18.6 mm, and the curve in the curved taper portion B was set while the point C (diameter: 4 mm) was used as a reference point, such the radius was increased from 2 mm to 7.5 mm (the diameter was increased from 4 mm to 15 mm). Such machining can be performed easily through use of a numerical control machine tool or the like. Thus, the truncated conical portion 14 was formed.

The above-described seed crystal 11 was held just above silicon melt for 20 minutes in order to preheat the seed crystal 11 sufficiently. Subsequently, the seed crystal 11 was lowered to be dipped into silicon melt at a constant speed of 3 mm/min. in order to melt the tip end of the seed crystal 11 until the diameter of the tip end became a predetermined diameter, immediately after which the seed crystal 11 was pulled upward from the silicon melt, cooled, and taken out of the furnace. The seed crystal was then subjected to Secco etching in order to check generation of slip dislocation. The results are shown in Table 3.

TABLE 3

| Test No. | Number of experiments | Max. dia. during melting (mm) | Number of ingots having slip dislocation | Dislocation-Elimination ratio [DF ratio] (%) |
|---|---|---|---|---|
| 9 | 10 | 5 | 0 | 100 |
| 10 | 10 | 6 | 0 | 100 |
| 11 | 10 | 7 | 0 | 100 |
| 12 | 10 | 8 | 0 | 100 |

From Table 3, it is understood that if the ridge lines of the surface of a portion where the diameter of the tip end portion is larger than about 5 mm—above which slip dislocation is easily generated—are made smooth curves that extend up to the straight body portion of the seed crystal without having unevenness, the rate of increase in the diameter and the rate of increase in thermal stress are well balanced, even if the seed crystal was lowered at a constant melting speed. Accordingly, slip dislocation is not generated until the diameter reaches a considerably large value.

Subsequently, an investigation was made for the case where optimization of the shape of the seed crystal was combined with optimization of the melting speed (Test Nos. 13–19).

In these tests, seed crystals that had been machined into the shape as shown in FIG. 6 were used. During the melting operation, each seed crystal was lowered at a speed of 3 mm/min. until the diameter of the tip end at the surface of the silicon melt became 4 mm, and thereafter the speed was decreased to 1.5 mm/min. and the melting operation was continued until the diameter of the tip end became a predetermined diameter. Subsequently, the seed crystal was immediately pulled upward, cooled, and taken out of the furnace. The seed crystal was then subjected to Secco etching in order to check generation of slip dislocation in the same manner as described above. The results are shown in Table 4.

TABLE 4

| Test No. | Number of experiments | Max. dia. during melting (mm) | Number of ingots having slip dislocation | Dislocation-Elimination ratio [DF ratio] (%) |
|---|---|---|---|---|
| 13 | 10 | 5 | 0 | 100 |
| 14 | 10 | 6 | 0 | 100 |
| 15 | 10 | 7 | 0 | 100 |
| 16 | 10 | 8 | 0 | 100 |
| 17 | 10 | 9 | 0 | 100 |
| 18 | 10 | 10 | 0 | 100 |

From Table 4, it is understood that the position above which slip dislocation is easily generated can be shifted to the thicker side if the ridge lines of the surface of a portion where the diameter of the tip end portion is larger than about 5 mm—above which slip dislocation is easily generated— are made smooth curves that extend up to the straight body portion of the seed crystal without having unevenness, and the melting speed is lowered from the initial speed when the diameter exceeds the critical diameter, above which slip dislocation is easily generated.

As described above, in the dislocation-free silicon monocrystal growth method according to the present invention in which necking is not performed, two factors; i.e., the special shape of the seed crystal and the change of the speed of melting the tapered tip end of the seed crystal, which have been described with reference to Tables 2 and 3, greatly affect the dislocation-elimination success ratio. Therefore, if the two factors are controlled simultaneously to fall within the respective proper ranges, generation of slip dislocation within the crystal can be prevented almost completely thanks to the synergistic effect. Thus, a high dislocation-elimination success ratio can be maintained with high reproducibility. Accordingly, the present invention contributes to growth of a heavy and large-diameter monocrystalline ingot, so that productivity and yield can be improved and cost can be lowered greatly.

Figure 8:
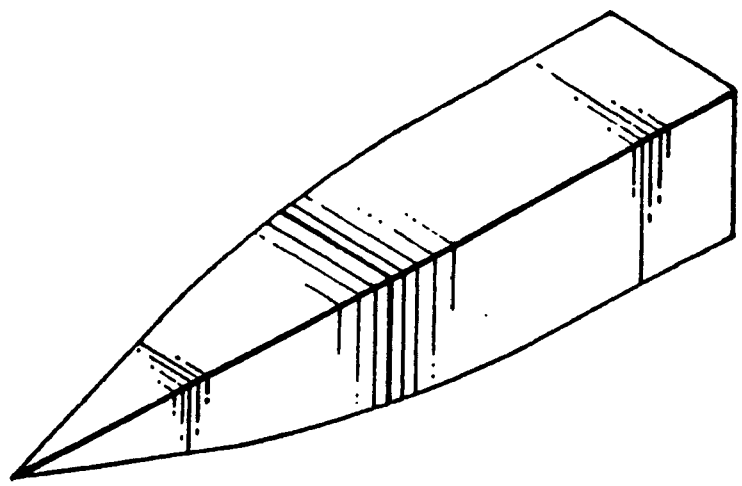
FIG. 8 is a perspective view showing the shape of a seed crystal having a pyramidal tip end used in a dislocation-free crystal growing method according to the present invention.

The seed crystal used in the dislocation-free silicon monocrystal growth method according to the present invention in which necking is not performed preferably has a shape in which a truncated conical or pyramidal portion formed by a curved outer surface is interposed between the tapered tip end portion of a conical or pyramidal shape and the straight body portion. Specific examples of the shape are shown by means of a vertical cross section of a seed crystal of FIG. 6, a perspective view of a conical seed crystal of FIG. 7, and a perspective view of a pyramidal seed crystal of FIG. 8.

More specifically, it is preferred to use a seed crystal machined into a curved shape that satisfies the following conditions. That is, the ridges of the outer surface of the truncated conical or pyramidal portion satisfy the following equation:

$$d^2r/dx^2 < 0$$

where r is the radius of a transversal cross section of the truncated conical or pyramidal portion, and x is the axial position of the transversal cross section.

The tapered tip end to be brought into contact with silicon melt has a sharp-pointed shape or a truncation thereof (e.g., a truncated or untruncated conical or pyramidal shape), and the straight taper portion extends from the tip end to a position where slip location is easily generated during melting operation. Since the position where slip location is easily generated changes somewhat depending on heat environment and the like during the pulling of a monocrystalline ingot, the position is preferably determined through experiments conducted for the specific environment. If the position is once determined, the melting speed is lowered from a position in the vicinity of the above-described position to perform gentle melting. Since the tapered tip end portion is thin and thermal stress is small, the taper of the tip end portion can be a straight taper ($dr/dx$=constant, $d^2r/dx^2$=0).

In the above-described seed crystal, the apex angle of the tapered tip end portion is preferably determined to be not greater than 28°. This mitigates thermal stress generated when the seed crystal comes into contact with silicon melt, so that generation of slip dislocation is prevented. Further, during the melting operation as well, generation of slip dislocation is prevented by means of the gentle change in the thickness of the conical or pyramidal portion.

Any pyramidal shape may be used insofar as the pyramid is a triangular pyramid or other polygonal pyramid. The straight portion held by a seed crystal holder preferably has a circular or rectangular columnar shape, and is preferably a few millimeters thicker than a predetermined target diameter of the melting operation, in consideration of strength and safety.

The present invention is not limited to the above-described embodiments. The above-described embodiments are mere examples, and those having the substantially same structure as that described in the appended claims and providing the similar action and effects are included in the scope of the present invention.

For example, in the above described embodiments, there is described the growth of silicon monocrystalline ingots having a diameter of 150 mm (6 inches). However, the present invention can cope with recent increase in the diameter of silicon monocrystalline ingots to 200 mm (8 inches)–400 mm (16 inches). In the present invention, since necking operation is not conducted and slip dislocation is not generated, monocrystalline ingots having any diameter, length and weight can be pulled in principle without use of a crystal holding apparatus if the diameter, length and weight do not exceed the physical limit of the silicon monocrystal itself.

Also, the present invention can be applied not only to the ordinary CZ method but also to the MCZ method (Magnetic field applied Czochralski crystal growth method) in which a magnetic field is applied to silicon melt when a silicon monocrystal is pulled. Therefore, the term "Czochralski method" or "CZ method" encompasses not only the ordinary CZ method but also the MCZ method.

As described above, the seed crystal used in the present invention has a shape in which a truncated conical or pyramidal portion formed by a curved outer surface is interposed between the tapered tip end portion of a conical or pyramidal shape and the straight body portion. The term "interposed" means that at least the truncated conical or pyramidal portion exists between the tapered tip end portion and the straight body portion. Therefore, the present invention is not limited to the shape where only the truncated conical or pyramidal portion exists between the tapered tip end portion and the straight body portion. For example, the truncated conical or pyramidal portion may be formed in the tapered tip end portion of a conical or pyramidal shape.

What is claimed is:

1. A method of manufacturing a silicon seed crystal used for manufacture of a silicon monocrystalline ingot according to the CZ method, wherein a tip end of the seed crystal to be brought into contact with silicon melt has a sharp-pointed shape or a truncation thereof, the method comprising the steps of:

mechanically machining a silicon monocrystalline ingot serving as a material of the seed crystal into the sharp-pointed shape or the truncation thereof; and etching at least the tip end portion to be brought into contact with silicon melt.

2. A method of manufacturing a silicon monocrystal ingot in accordance with the CZ method in which a seed crystal is brought into contact with a silicon melt and is then pulled slowly, while being rotated, in order to grow a silicon monocrystalline ingot, wherein the method comprises the steps of:

using a seed crystal manufactured according to the method of claim 1;

gently bringing a tip end of the seed crystal into contact with the silicon melt and lowering the seed crystal at a low speed in order to melt the tip end of the seed crystal until the thickness of the tip end reached a given level; and slowly pulling the seed crystal to grow a silicon monocrystalline ingot having given diameters without performing necking.

3. A method of manufacturing a silicon seed crystal used for manufacture of a silicon monocrystalline ingot according to the CZ method, wherein a tip end of the seed crystal to be brought into contact with silicon melt has a sharp-pointed shape or a truncation thereof, the method comprising the steps of:

selecting a silicon monocrystalline ingot manufactured in accordance with the CZ method and having a tail portion; and using the tail portion as the sharp-pointed portion of the seed crystal.

4. A method of manufacturing a silicon monocrystal ingot in accordance with the CZ method in which a seed crystal is brought into contact with a silicon melt and is then pulled slowly, while being rotated, in order to grow a silicon monocrystalline ingot, wherein the method comprises the steps of:

using a seed crystal manufactured according to the method of claim 3;

gently bringing a tip end of the seed crystal into contact with the silicon melt and lowering the seed crystal at a low speed in order to melt the tip end of the seed crystal until the thickness of the tip end reached a given level; and slowly pulling the seed crystal to grow a silicon monocrystalline ingot having given diameters without performing necking.

5. A method of manufacturing a silicon monocrystal ingot in accordance with the CZ method in which a silicon seed crystal having a sharp-pointed end is brought into contact with a silicon melt, is melted therein, and is then pulled in order to grow the silicon monocrystalline ingot without performing necking, wherein when the sharp-pointed tip end of the silicon seed crystal is melted into the silicon melt, a melting speed after a position where the thickness of the tip end of the seed crystal reaches a critical thickness above which slip dislocation easily occurs is made lower than a melting speed before that position.

6. A method of manufacturing a silicon monocrystal ingot according to claim 5, wherein there is used a silicon seed crystal having a tapered tip end portion of a conical or pyramid shape, a straight body portion of a cylindrical columnar or rectangular columnar shape, and an intermediate portion located between the tip end portion and the straight body portion and having a truncated cone or pyramid shape formed by a curved outer surface.

7. A method of manufacturing a silicon monocrystal ingot in accordance with the CZ method in which a silicon seed crystal having a sharp-pointed end is brought into contact with a silicon melt, is melted therein, and is then pulled in order to grow the silicon monocrystalline ingot without performing necking, wherein when the sharp-pointed tip end of the silicon seed crystal is melted into the silicon melt, a speed of melting is changed in two stages such that the speed of melting in the second stage is made lower than that in the first stage.

8. A method of manufacturing a silicon monocrystal ingot according to claim 7, wherein there is used a silicon seed crystal having a tapered tip end portion of a conical or pyramid shape, a straight body portion of a cylindrical columnar or rectangular columnar shape, and an intermediate portion located between the tip end portion and the straight body portion and having a truncated cone or pyramid shape formed by a curved outer surface.

9. A method of manufacturing a silicon monocrystal ingot in accordance with the CZ method in which a silicon seed crystal having a sharp-pointed end is brought into contact with a silicon melt, is melted therein, and is then pulled in order to grow the silicon monocrystalline ingot without performing necking, wherein there is used a silicon seed crystal having a tapered tip end portion of a conical or pyramidal shape, a straight body portion of a cylindrical columnar or rectangular columnar shape, and an intermediate portion located between the tip end portion and the straight body portion and having a truncated conical or pyramidal shape formed by a curved outer surface.

* * * * *